(12) United States Patent
Kwak

(10) Patent No.: US 9,529,379 B2
(45) Date of Patent: *Dec. 27, 2016

(54) TIMING SYNCHRONIZATION CIRCUIT WITH LOOP COUNTER

(71) Applicant: Micron Technology, Inc., Boise, ID (US)

(72) Inventor: Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

This patent is subject to a terminal disclaimer.

(21) Appl. No.: 14/280,840

(22) Filed: May 19, 2014

(65) Prior Publication Data

US 2014/0258764 A1  Sep. 11, 2014

Related U.S. Application Data

(63) Continuation of application No. 12/755,664, filed on Apr. 7, 2010, now Pat. No. 8,732,509, which is a
(Continued)

(51) Int. Cl.
*G06F 1/12* (2006.01)
*G06F 1/04* (2006.01)
(Continued)

(52) U.S. Cl.
CPC . *G06F 1/04* (2013.01); *G06F 1/10* (2013.01); *G06F 1/12* (2013.01); *G11C 7/22* (2013.01);
(Continued)

(58) Field of Classification Search
CPC .......... G06F 11/1679; G06F 1/04; G06F 1/10; G06F 1/12; G11C 7/22; G11C 7/222; H03L 7/0812
See application file for complete search history.

(56) References Cited

U.S. PATENT DOCUMENTS 5,004,933 A  4/1991 Widener
6,111,810 A  8/2000 Fujita
(Continued)

FOREIGN PATENT DOCUMENTS

CN  101752009 A  6/2010
JP  2013-222997  10/2013
TW  201303735  1/2013

OTHER PUBLICATIONS

Office Action received for KR Appln No. 10-2013-7027649, dated Jan. 30, 2015, 5 pages.
(Continued)

*Primary Examiner* — M Elamin
(74) *Attorney, Agent, or Firm* — Dorsey & Whitney LLP

(57) ABSTRACT

An apparatus for synchronizing an output clock signal with an input clock signal includes a first timing synchronization circuit, control logic, and a counter. The first timing synchronization circuit is operable to generate a delay to synchronize a reference clock signal representative of the input clock signal with a feedback clock signal representative of the output clock signal responsive a strobe signal. The control logic is operable to generate an enable signal based on the reference clock signal and generate the strobe signal based on the feedback clock signal. The counter is operable to count cycles of the reference clock signal occurring between the enable signal and the strobe signal to generate a loop count for the first timing synchronization circuit.

19 Claims, 4 Drawing Sheets

Related U.S. Application Data continuation of application No. 11/612,798, filed on Dec. 19, 2006, now Pat. No. 7,716,510.

(51) Int. Cl.
*G11C 7/22* (2006.01)
*H03L 7/081* (2006.01)
*G06F 1/10* (2006.01)
G06F 11/16 (2006.01)

(52) U.S. Cl.
CPC ............ *G11C 7/222* (2013.01); *H03L 7/0812* (2013.01); *G06F 11/1679* (2013.01)

(56) References Cited

U.S. PATENT DOCUMENTS

| | | | |
|---|---|---|---|
| 6,219,384 B1 | 4/2001 | Kliza et al. |
| 6,260,128 B1 | 7/2001 | Ohshima et al. |
| 6,275,077 B1 | 8/2001 | Tobin et al. |
| 6,327,318 B1 | 12/2001 | Bhullar et al. |
| 6,424,592 B1 | 7/2002 | Maruyama |
| 6,438,055 B1 | 8/2002 | Taguchi et al. |
| 6,459,313 B1 | 10/2002 | Godbee et al. |
| 6,489,823 B2 | 12/2002 | Iwamoto |
| 6,510,095 B1 | 1/2003 | Matsuzaki et al. |
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,336,752 B2 | 2/2008 | Vlasenko et al. |
| 7,340,632 B2 | 3/2008 | Park |
| 7,375,560 B2 | 5/2008 | Lee et al. |
| 7,411,852 B2 | 8/2008 | Nishioka et al. |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,590,013 B2 | 9/2009 | Yu et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,643,334 B1 | 1/2010 | Lee et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,698,589 B2 | 4/2010 | Huang |
| 7,715,260 B1 | 5/2010 | Kuo et al. |
| 7,716,510 B2 * | 5/2010 | Kwak ................ G11C 7/22 713/400 |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,885,365 B2 | 2/2011 | Hagleitner et al. |
| 7,913,103 B2 | 3/2011 | Gold et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,004,884 B2 | 8/2011 | Franceschini et al. |
| 8,018,791 B2 | 9/2011 | Kwak |
| 8,030,981 B2 | 10/2011 | Kim |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,644,096 B2 | 2/2014 | Bringivijayaraghavan |
| 8,717,078 B2 | 5/2014 | Idgunji et al. |
| 8,732,509 B2 * | 5/2014 | Kwak ................ G11C 7/22 713/400 |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 2001/0015924 A1 | 8/2001 | Arimoto et al. |
| 2002/0057624 A1 | 5/2002 | Manning |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2005/0024107 A1 | 2/2005 | Takai et al. |
| 2005/0047222 A1 | 3/2005 | Rentschler |
| 2005/0132043 A1 | 6/2005 | Wang et al. |
| 2005/0270852 A1 | 12/2005 | Dietrich et al. |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 * | 8/2006 | Hwang ................ G06F 1/10 375/354 |
| 2006/0193194 A1 | 8/2006 | Schnell |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0082707 A1 | 4/2008 | Gupta et al. |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0066422 A1 | 3/2010 | Tsai |
| 2010/0124090 A1 | 5/2010 | Arai |
| 2010/0124102 A1 | 5/2010 | Lee et al. |
| 2010/0165769 A1 | 7/2010 | Kuroki |
| 2010/0165780 A1 | 7/2010 | Bains et al. |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0327926 A1 | 12/2010 | Takahashi |
| 2011/0047319 A1 | 2/2011 | Jeon et al. |

(56) References Cited

U.S. PATENT DOCUMENTS

| | | |
|---|---|---|
| 2011/0055671 A1 | 3/2011 | Kim et al. |
| 2011/0057697 A1 | 3/2011 | Miyano |
| 2011/0102039 A1 | 5/2011 | Shin |
| 2011/0228625 A1 | 9/2011 | Bringivijayaraghavan et al. |
| 2011/0238866 A1 | 9/2011 | Zitlaw |
| 2011/0238941 A1 | 9/2011 | Xu et al. |
| 2011/0298512 A1 | 12/2011 | Kwak |
| 2011/0314324 A1 | 12/2011 | Ozdemir |
| 2012/0084575 A1 | 4/2012 | Flores et al. |
| 2012/0124317 A1 | 5/2012 | Mirichigni et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002320 A1 | 1/2013 | Lin et al. |
| 2013/0141994 A1 | 6/2013 | Ito et al. |
| 2013/0194013 A1 | 8/2013 | Kwak et al. |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0293719 A1 | 10/2014 | Jung |
| 2015/0156009 A1 | 6/2015 | Bogdan |
| 2015/0170725 A1 | 6/2015 | Kwak |
| 2015/0235691 A1 | 8/2015 | Kwak |
| 2015/0340072 A1 | 11/2015 | Mazumder |
| 2016/0056807 A1 | 2/2016 | Neidengard et al. |

OTHER PUBLICATIONS

"Interfacing DDR SDRAM with Stratix II Devices", Version 3.2, Altera Corp, Sep. 2008.

Lee, "How to Implement DDR SGRAM in Graphic System", Samsung Electric, 4Q1998.

* cited by examiner

TIMING SYNCHRONIZATION CIRCUIT WITH LOOP COUNTER

CROSS-REFERENCE TO RELATED APPLICATION

This application is a continuation of pending U.S. patent application Ser. No. 12/755,664, filed Apr. 7, 2010, and issued as U.S. Pat. No. 8,732,509, which is a continuation of U.S. patent application Ser. No. 11/612,798, filed Dec. 19, 2006, and issued as U.S. Pat. No. 7,716,510 on May 11, 2010. These applications and patent are incorporated by reference herein, for any purpose.

BACKGROUND OF THE INVENTION

The present invention relates generally to the field of timing synchronization and, more particularly, to a timing synchronization circuit with loop counter.

Many high speed electronic systems operate with critical timing requirements that dictate a need to generate a periodic clock waveform possessing a precise timing relationship with respect to some reference signal. The improved performance of computing integrated circuits and the growing trend to include several computing devices on the same board present a challenge with respect to synchronizing the time frames of all the components.

While the operation of all components in the system should be highly synchronized, i.e., the maximum skew in time between significant edges of the internally generated clocks of all the components should be minimized, it is not enough to feed the external clock of the system to all the components. This is because different chips may have different manufacturing parameters, which, when taken together with additional factors such as ambient temperature, voltage, and processing variations, may lead to large differences in the phases of the respective chip generated clocks.

Synchronization can be achieved by using a timing circuit, such as a digital delay locked loop (DDLL) circuit, to detect the phase difference between clock signals of the same frequency and produce a digital signal related to the phase difference. DDLL circuits may require a relatively large number of clock cycles to synchronize. As a result of this significant lock period, DDLL circuits are not typically disabled after a lock is achieved to conserve power. DDLL circuits are also not well suited to handle large temperature or voltage shifts due to their slow response time. In conjunction with a DLL circuit, an open-loop topology may be used, such as a measure-controlled delay (MCD) circuit, where a timing measurement directly controls a variable delay. MCD circuits exhibit a fast lock capability (e.g., within 1-4 clock cycles after initialization). The MCD circuit generates an initial measurement, and the DDLL takes over to maintain the lock and track variations over time.

BRIEF DESCRIPTION OF THE SEVERAL VIEWS OF THE DRAWINGS

The invention will hereafter be described with reference to the accompanying drawings, wherein like reference numerals denote like elements, and.

DETAILED DESCRIPTION OF THE INVENTION

Figure 1:
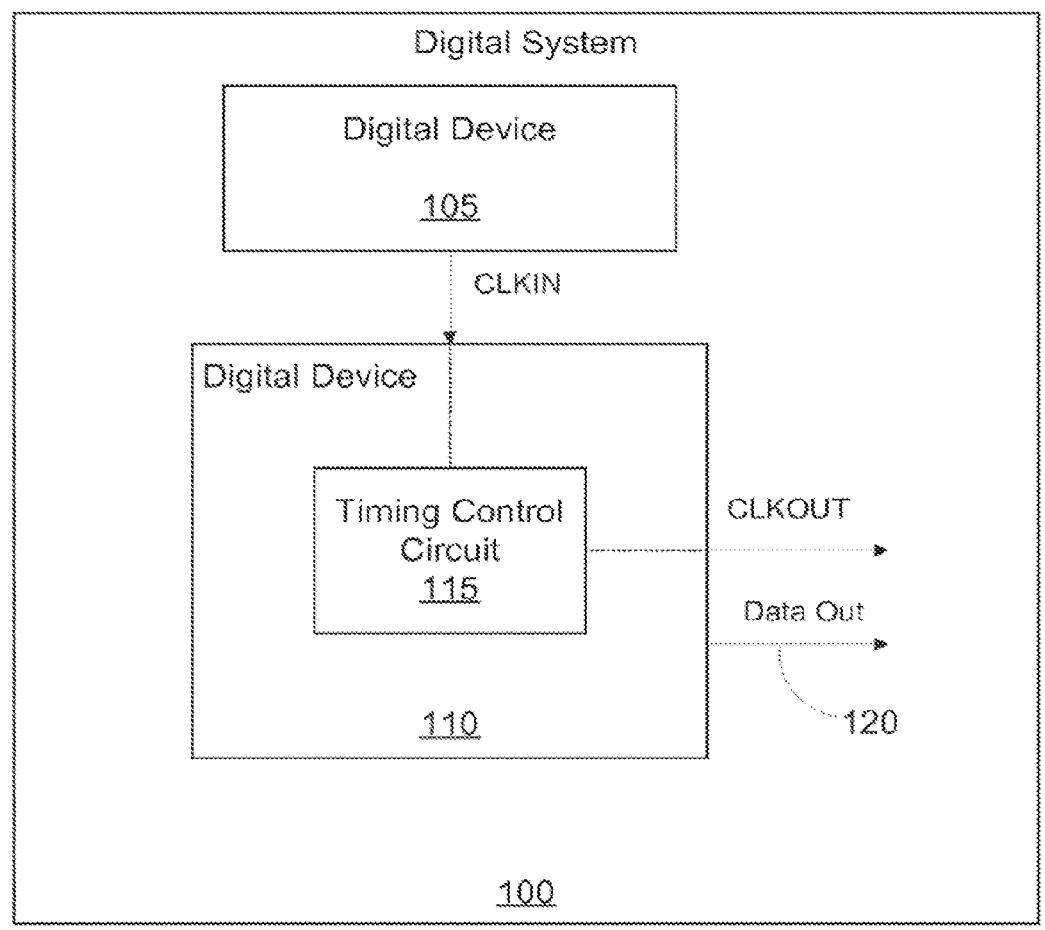
FIG. 1 is a simplified block diagram of a digital system having a timing control circuit in accordance with the present invention.

One or more specific embodiments of the present invention are described below. It is specifically intended that the present invention not be limited to the embodiments and illustrations contained herein, but include modified forms of those embodiments including portions of the embodiments and combinations of elements of different embodiments as come within the scope of the following claims.

Embodiments of the present invention will now be described with reference to the attached figures. Various structures, systems and devices are schematically depicted in the drawings for purposes of explanation only and so as to not obscure the embodiments of the present invention with details that are well known to those skilled in the art. Nevertheless, the attached drawings are included to describe and explain illustrative examples of embodiments of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. Nothing in this application is considered critical or essential to the present invention unless explicitly indicated as being "critical" or "essential."

Referring now to the drawings wherein like reference numbers correspond to similar components throughout the several views and, specifically, referring to FIG. 1, the present invention shall be described in the context of a digital system 100. The digital system 100 includes a first digital device 105 coupled to a second digital device 110. The first digital device 105 provides a reference clock signal (CLKIN) to the second digital device 110. The second digital device 110 uses the CLKIN signal to synchronize its internal clocks using a timing control circuit 115 to generate an output clock signal (CLKOUT). As an illustrative example, the first digital device 105 may be a microprocessor and the second digital device 110 may be a memory device that synchronizes its output data on a data line 120 with the CLKOUT signal.

Figure 2:
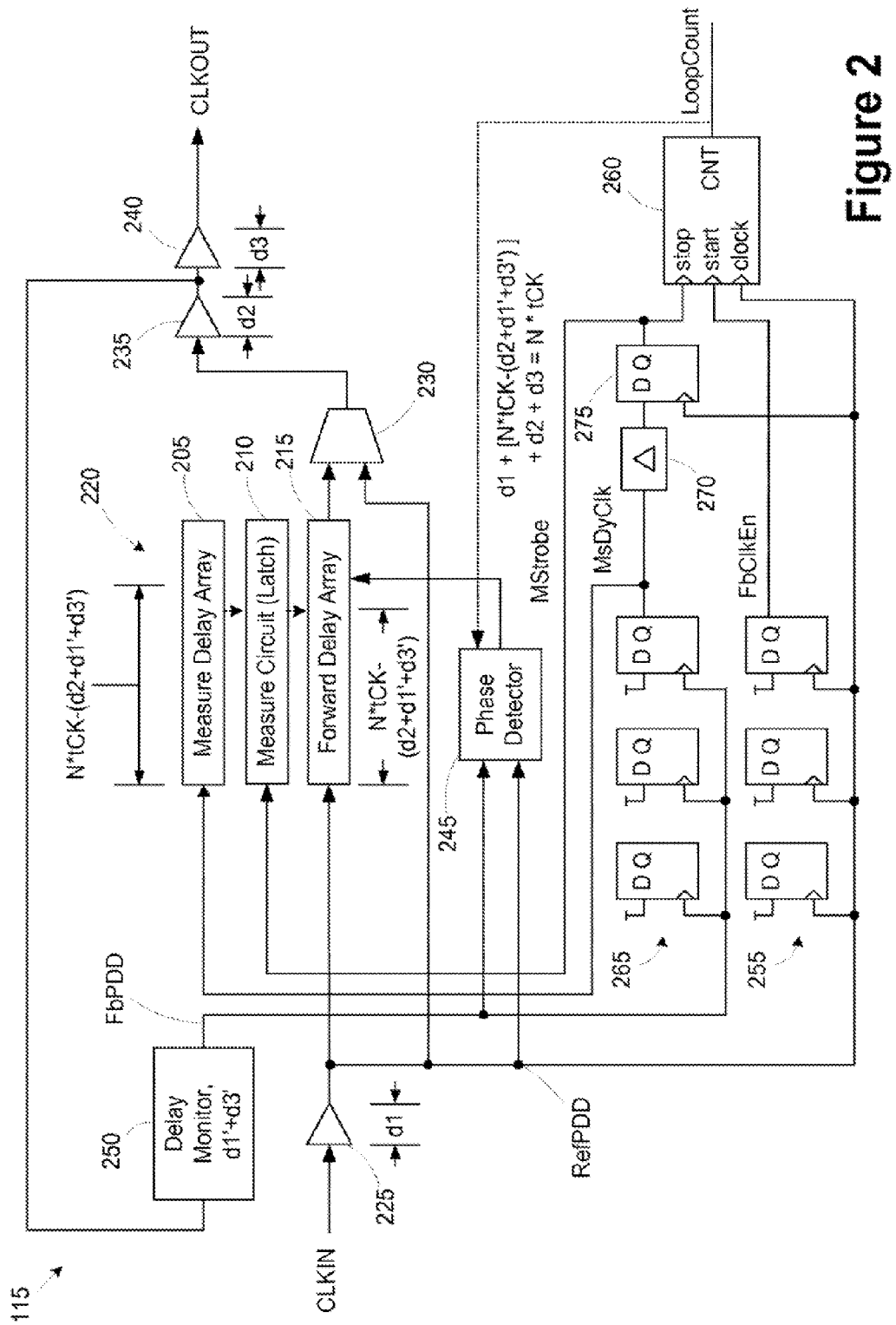
FIG. 2 is a simplified block diagram of the timing control circuit of FIG. 1.

Turning now to FIG. 2, a simplified block diagram of the timing control circuit 115 in accordance with one illustrative embodiment of the present invention is illustrated. The timing control circuit 115 includes a measure delay array 205, a measure circuit 210, and a forward delay array 215 that combine to form an MCD circuit 220. An external clock signal (CLKIN) is provided to a buffer circuit 225, which is in turn coupled to the forward delay array 215. The buffer circuit 225 represents the input circuitry of the second digital device 110 (see FIG. 1). It may include one or more buffers and/or other logic circuitry.

A multiplexer 230 is coupled to receive inputs from the buffer 225 and the forward delay array 215. The multiplexer 230 is controlled during a measurement initialization cycle to bypass the forward delay array 215 until the timing signals have propagated through the timing control circuit 115 and the MCD circuit 220 can be locked, as will be described in greater detail below. Following the measurement initialization cycle, the multiplexer 230 is controlled to select the output of the forward delay array 215 as its input.

Although embodiments of the present invention are described with reference to an MCD circuit to establish the initial synchronization between the input and output clock signals, the scope of these embodiments is not so limited. Other types of synchronization circuits, including a synchronous mirror delay circuit and a phase locked loop circuit may be used.

The output of the multiplexer 230 is provided to a buffer circuit 235, and the buffer circuit 235 is in turn coupled to another buffer circuit 240. The buffer circuit 240 represents the output circuitry (i.e., output drivers, slew rate control devices, etc.) of the second digital device 110 (see FIG. 1). It may include one or more buffers and/or other logic circuitry. The output of the buffer circuit 240 represents the output clock signal (CLKOUT) used by the digital device 110.

A phase detector 245 is coupled to the buffer 225 for receiving a reference clock signal (RefPDD) and to a delay monitor 250 for receiving a feedback clock signal (FbPDD). The phase detector 245 measures a phase difference between the RefPDD signal provided by the buffer circuit 225 and the FbPDD signal exiting; the delay monitor 250. The phase detector 245 controls the amount of delay imposed by the forward delay array 215 responsive to the measured phase difference.

The delay monitor 250 models the delay introduced into the input clock signal (CLKIN) by the buffer circuit 225 (d1) and the output circuitry of the second digital device 110 (d3) (e.g., the buffer circuit 240) to generate the feedback clock signal (FbPDD). The modeled delays are referenced as d1' and d3' to correspond to the actual delays d1 and d3, respectively. The output of the buffer 235 is provided to the delay monitor 250. Because the output of the buffer circuit 235 is fed to the delay monitor 250, its delay (d2) need not be modeled by the delay monitor 250. The output of the phase detector 245 is provided to the forward delay array 215 for controlling the synchronization after the completion of the measurement initialization cycle.

The reference clock signal (RefPDD) generated by the buffer 225 is coupled provide a clock signal to a first series of data flip flops 255 that generate a feedback clock enable signal (FbClkEn), which is provided as a start signal to a counter 260. The RefPDD signal also clocks the counter 260.

The feedback clock signal (FbPDD) is coupled provide a clock signal to a second series of data flip flops 265 that generate a measurement delay clock signal. (MsDyClk) as an output. The MsDyClk signal is provided to a delay element 270. The delay element 270 provides a fixed minimum delay to allow the timing control 115 to operate over a wide range of conditions. The amount of delay provided by the delay element 270 may vary depending on the particular implementation. The delay element 270 is coupled to a data flip flop 275 that is clocked by the RefPDD signal to generate a measurement pulse signal (MStrobe). The MStrobe signal is coupled to the counter 260 as a stop input.

The MStrobe signal is also provided to the measure circuit 210 to trigger the synchronization of the input and output clock signals.

The operation of the timing control circuit 115 is now described in greater detail. Prior to synchronization, the multiplexer 230 is controlled to bypass the forward delay array 215. Hence, the feedback clock signal, FbPDD, is simply the reference clock signal, RefPDD, after it passes through the multiplexer 230, the buffer 235, and the delay monitor 250. When the input clock signal begins to transition, the RefPDD signal clocks the data flip flops 255. At a later point in time, the RefPDD signal propagates through the feedback path and the rising edges are seen in the FbPDD signal, which clocks the flip flops 265.

Following the third clock pulse, i.e., due to there being three flip flops 255, the FbClkEn signal is asserted, and the counter 260 begins counting each pulse of the RefPDD signal. The FbPDD signal clocks the flip flops 265, and after the third pulse, the MsDyClk signal is asserted, which clocks the measure delay array 205. The MsDyClk signal generated by the data flip flops 265 propagates through the measure delay array 205 until the measure circuit 210 is triggered. The measure circuit 210 includes a series of latches (not shown) that are triggered by the MStrobe signal. The particular latches triggered are those that correspond to the position of the pulse in the measure delay array 205.

Subsequently, the MsDyClk signal passes through the delay element 270 and is latched in the data flip flop 275 following the next rising edge of the RefPDD signal, thus generating the MStrobe signal. The MStrobe signal stops the counter 260 and latches the measure circuit 210, thereby configuring the forward delay array 215 to synchronize the CLKIN and CLKOUT signals. The start and stop signals provided to the counter 260 are synchronized with the rising edge of the RefPDD signal. The value of the counter 260, LoopCount, represents the number of clock signals required for the reference clock signal to propagate through the feedback path. The number of flip flops in the groups 255, 265 may vary depending on the particular implementation. In the illustrated embodiment, thee stages are provided to allow the feedback path to be populated with clock signals and stabilize prior to synchronizing the clock signals.

After the forward delay array 215 is configured, the multiplexer 230 is configured to select the forward delay array 215 as its input. The output of the forward delay array 215 then passes through the buffer 235 and the delay monitor 250 and becomes the source for the feedback clock signal, FbPDD, provided to the phase detector 245. The phase detector 245 subsequently controls the forward delay array 215 to maintain the synchronization of the CLKIN and CLKOUT signals. The FbPDD signal is synchronized with the RefPDD signal with a multiple dock cycle difference, N*tCK. The LoopCount output of the counter 260 represents the value of N. Generally, a higher frequency clock signal results in a larger value for N.

Figure 3:
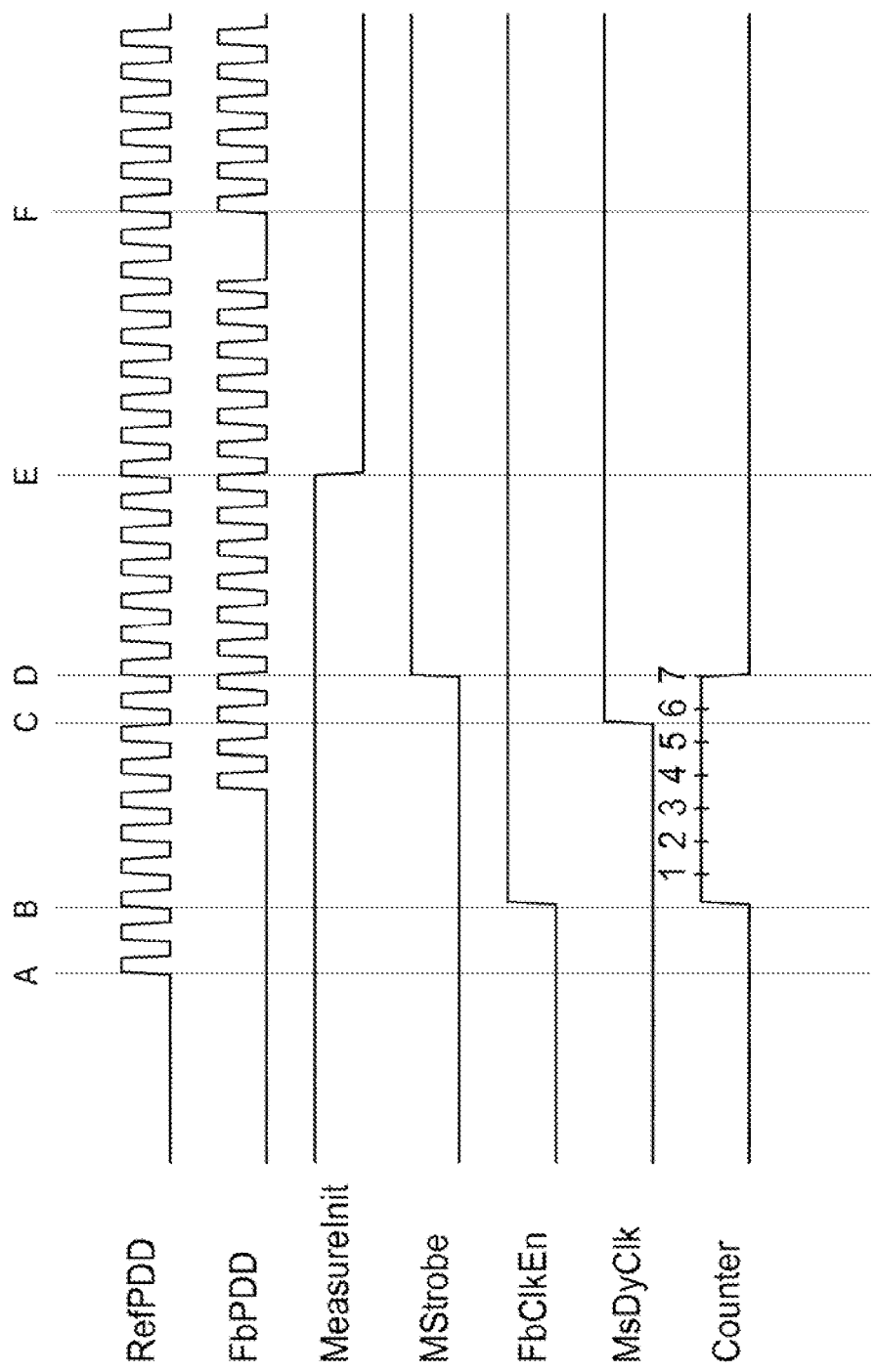
FIG. 3 is a timing diagram illustrating the operation of the timing control circuit of FIG. 2.

Turning now to FIG. 3, a timing diagram illustrating the operation of the timing control circuit 115 is provided. The reference clock, RefPDD, and corresponding feedback clock, FbPDD, are illustrated. A MeasureInit signal represents the mode of the measure circuit 210. The MCD circuit 220 is operated during the measure initialization mode, and the DDL is operated otherwise. The measurement strobe, MStrobe, feedback clock enable, FbClkEn, and measurement delay clock, MsDyClk signals are also illustrated. A counter signal is provided to illustrate the time period that the counter 260 is enabled. The Counter signal is not an actual signal employed in the timing control circuit 115, but rather is a composite of the FbClkEn and MStrobe signals that start and stop the counter 260.

At time point A, the reference clock signal begins transitioning. The timing control circuit 115 operates in measurement initialization mode, so the MeasureInit signal is asserted and the multiplexer 230 is configured to bypass the forward delay array 215. At time point B, the third cycle of the RefPDD signal is latched by the flip flops 255, thus asserting the FbClkEn signal and starting the counter 260. At time point C, the third cycle of the FbPDD signal is latched by the flip flops 265 indicating that the reference clock has propagated the feedback path and causing the assertion of the MsDyClk signal. The MsDyClk signal pulses the measure delay array 205.

At time point D, the MsDyClk signal, as delayed by the delay element 270 is latched in the flip flop 275 causing the assertion of the MStrobe signal. The MStrobe signal activates the measure circuit 210 to determine the position of the previous MsDyClk pulse in the measure delay array 205 and stop the counter 260. The delay in the forward delay array 215 is set by the position latched in the forward delay array 215 to synchronize the reference and feedback clock signals.

At time point E, the MeasureInit signal is deasserted and the multiplexer 230 is configured to use the signal passing through the forward delay array 215 for the output clock signal, CLKOUT. At time point F, the signal passing through the forward delay array 215 to the buffer 235 propagates through the feedback path to the delay monitor 250 to become the FbPDD signal. The RefPDD and FbPDD signals are provided to the phase detector 245 for subsequent synchronization control. Subsequent changes in the relative phases of the RefPDD and FbPDD signals will cause the phase detector 245 to adjust the delay provided by the forward delay array 215 to maintain synchronization.

The LoopCount value determined by the counter 260 represents the value of N, which identifies the number of clock cycles that the output clock is offset from the input clock. The LoopCount value has various uses. For example, the phase detector 245 employs the LoopCount value to ensure that any changes applied to the delay of the forward delay array 215 are propagated through the feedback path and are reflected in the FbPDD signal prior to making another phase comparison. In other words, the phase detector 245 is configured such that it does not update any more frequently than N clock cycles, as specified by the LoopCount. The LoopCount value is also useful for establishing read latency in a memory device. An exemplary device employing the LoopCount is described in U.S. Pat. No. 6,687,185, entitled "METHOD AND APPARATUS FOR SETTING AND COMPENSATING READ LATENCY IN A HIGH SPEED DRAM," assigned to the assignees of the present application, and incorporated herein by reference in its entirety.

Figure 4:
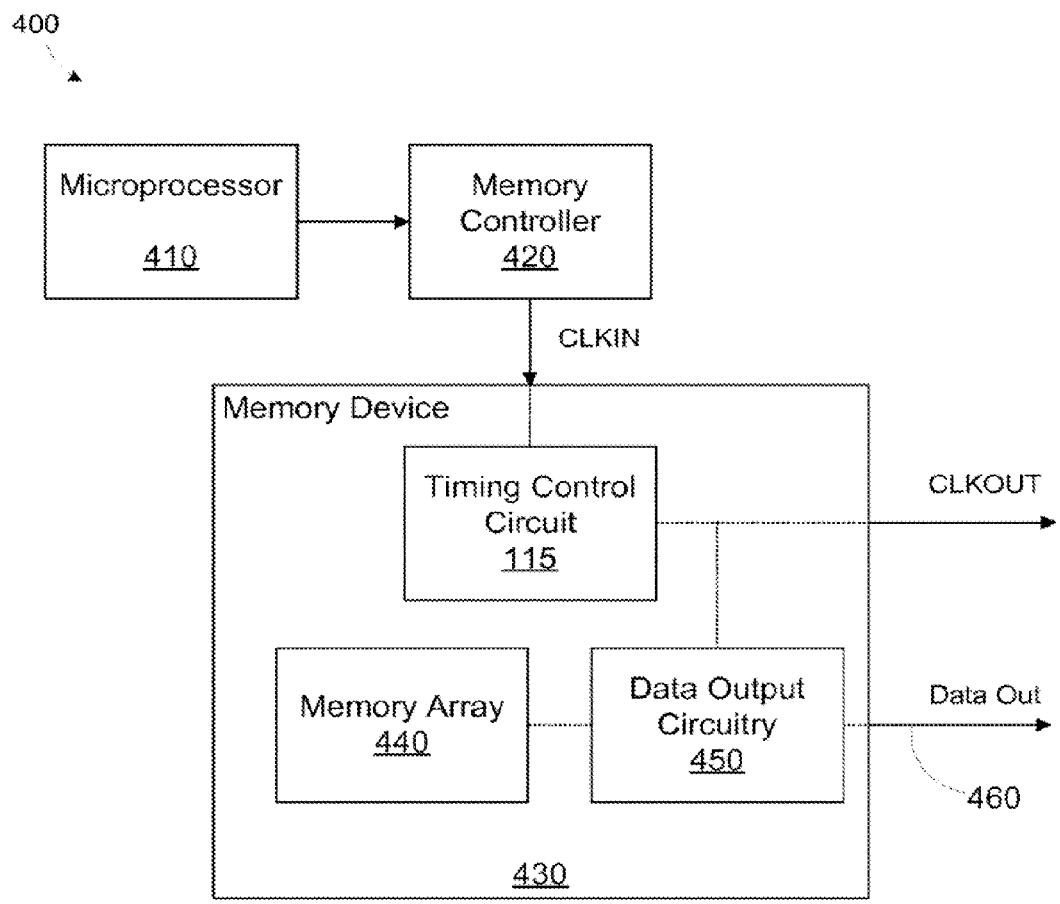
FIG. 4 is a simplified block diagram of a system in one embodiment of the present invention including the timing control circuit of FIG. 2.

Turning now to FIG. 4, a simplified block diagram of a computer system 400 incorporating the timing control circuit 115 is shown. The computer system 400 includes a microprocessor 410 coupled to a memory controller 420. The memory controller 420 is coupled to a memory device 430. The microprocessor 410 issues commands to the memory controller 420 to access data stored in the memory device 430. The memory device 430 includes a memory array 440 for storing data and data output circuitry 450 for outputting data read from the memory array 440 on a data output path 460. The memory controller 420 provides the input clock signal (CLKIN) to the memory device 430.

The timing control circuit 115 receives the input clock signal and generates the output clock signal (CLKOUT) for clocking the data output circuitry 450. For clarity and to avoid obscuring the instant invention, only those interconnections and modules related to the control of the timing in the memory device 430 are illustrated. The microprocessor 410, memory controller 420, and memory device 430 (i.e., with the exception of the timing control circuit 115) may take on numerous forms, depending on the particular implementation. Those of ordinary skill in the art are knowledgeable regarding the particular construct and operation of these devices.

The particular embodiments disclosed above are illustrative only, as the embodiments of the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. An apparatus, comprising:
   a timing circuit configured to receive a reference clock signal and to provide a feedback clock signal based on the reference clock signal, the timing circuit further configured to delay the reference clock signal responsive to a strobe signal to synchronize the reference clock signal and the feedback clock signal, the strobe signal based on the feedback clock signal; and
   a counter configured to receive the reference clock signal, an enable signal, and the strobe signal, the counter further configured to start counting a number of cycles of the reference clock signal responsive to receipt of the enable signal and to stop counting the number of cycles of the reference clock signal responsive to receipt of the strobe signal.

2. The apparatus of claim 1, wherein the timing circuit is configured to delay the reference clock signal using an initial delay while operating in a first mode and to adjust the delay while operating in a second mode.

3. The apparatus of claim 1, wherein the timing circuit is configured to selectively enable each of a plurality of latches to delay the reference clock signal.

4. The apparatus of claim 1, wherein the timing circuit comprises a measure control delay circuit, a synchronous mirror delay circuit, a phase locked loop circuit, or a combination thereof.

5. The apparatus of claim 1, further comprising:
   a phase detector coupled to the counter and configured to receive the loop count, the phase detector further configured to adjust the delay based on the loop count.

6. The apparatus of claim 1, further comprising:
   a first plurality of flip-flops coupled to the counter and configured to receive the reference clock signal, the first plurality of flip-flops further configured to provide the enable signal based on the reference clock signal.

7. An apparatus, comprising:
   a timing circuit configured to receive a reference clock signal and to provide a feedback clock signal based on the reference clock signal, the timing circuit further configured to delay the reference clock signal responsive to a strobe signal to synchronize the reference clock signal and the feedback clock signal, the strobe signal based on the feedback clock signal;
   a counter configured to receive the reference clock signal, an enable signal, and the strobe signal, the counter further configured to count a number of cycles of the reference clock signal occurring between receipt of the enable signal and receipt of the strobe signal;

a first plurality of flip-flops coupled to the counter and configured to receive the reference clock signal, the first plurality of flip-flops further configured to provide the enable signal based on the reference clock signal;

a second plurality of flip-flops configured to receive the feedback signal and provide a first control signal based on the feedback signal;

a delay element coupled to the second plurality of flip-flops and configured to receive the first control signal, the delay element further configured to delay the first control signal to provide a second control signal; and a strobe flip-flop coupled to the delay element and the counter and configured to receive the second control signal and the reference clock signal, the strobe flip-flop configured to provide the strobe based on second control signal and the reference clock signal.

8. A method, comprising:

bypassing a delay array to provide a feedback clock signal during a first mode of operation;

configuring a delay of a delay array based on a reference clock signal and the feedback clock signal;

providing a loop count from a counter based, at least in part, on a number of cycles for the reference clock signal to propagate through a feedback path; and providing the reference clock signal to the delay array to provide the feedback clock signal during a second mode of operation.

9. The method of claim 8, wherein providing a loop count based, at least in part, on a number of cycles for the reference clock signal to propagate through a feedback path comprises:

providing a loop count based, at least in part, on a number of cycles for the reference clock signal to propagate through a feedback path to generate the feedback signal.

10. The method of claim 8, further comprising:

adjusting the delay of the delay array based on a phase difference between the feedback clock signal and the reference clock signal.

11. The method of claim 8, wherein bypassing a delay array to provide a feedback clock signal comprises:

selectively bypassing the delay array using a multiplexer.

12. The method of claim 8, wherein configuring a delay of a delay array based on a reference clock signal and the feedback clock signal comprises:

selectively enabling each of a plurality of latches.

13. A method, comprising:

providing an enable signal to a timing synchronization circuit responsive to a reference clock signal;

providing a strobe signal responsive to a feedback clock signal;

configuring an amount of delay based on the strobe signal; and enabling a counter to count a number of cycles of the reference clock signal responsive to receipt of the enable signal;

disabling the counter from counting the number of cycles of the reference clock signal responsive to receipt of the strobe signal; and adjusting the amount of delay based on the number of cycles.

14. The method of claim 13, wherein providing a strobe signal responsive to a feedback clock signal comprises:

delaying the strobe signal with a delay element.

15. The method of claim 13, wherein providing an enable signal to a timing synchronization circuit responsive to a reference clock signal comprises:

clocking each of a plurality of flip-flops with the reference clock signal to provide the enable signal.

16. The method of claim 13, wherein adjusting the amount of delay based on the number of cycles comprises:

synchronizing the reference clock signal and the feedback clock signal.

17. The method of claim 13, wherein the strobe signal is based on each of the reference clock signal and the feedback clock signal.

18. The method of claim 13, wherein configuring an amount of delay based on the strobe signal comprises:

selectively enabling each of a plurality of latches of a measure circuit based on a location of a delay control signal, the delay control signal based on the feedback clock signal.

19. The method of claim 13, further comprising:

providing a loop count indicative of the number of cycles to a phase detector.

* * * * *